United States Patent [19]

Beasom

[11] Patent Number: 5,264,719
[45] Date of Patent: Nov. 23, 1993

[54] HIGH VOLTAGE LATERAL SEMICONDUCTOR DEVICE

[75] Inventor: James D. Beasom, Melbourne Village, Fla.

[73] Assignee: Harris Corporation, Melbourne, Fla.

[21] Appl. No.: 705,509

[22] Filed: May 24, 1991

Related U.S. Application Data

[63] Continuation of Ser. No. 242,405, Sep. 8, 1988, abandoned, which is a continuation-in-part of Ser. No. 831.384, Jan. 7, 1986, Pat. No. 4,823,173.

[51] Int. Cl.⁵ ............................................. H01L 29/80
[52] U.S. Cl. .................................... 257/335; 257/336; 257/339
[58] Field of Search ...................... 357/38, 55, 23.8, 46

[56] References Cited

U.S. PATENT DOCUMENTS 4,626,879 12/1986 Colak .................. 357/23.8
4,628,341 12/1986 Thomas ................ 357/23.8
4,811,075 3/1989 Eklund et al. ........... 357/46
4,994,889 2/1991 Takeuchi et al. ......... 357/55
4,994,904 2/1991 Nakagawa et al. ........ 357/38

Primary Examiner—Rolf Hille
Assistant Examiner—Roy Potter
Attorney, Agent, or Firm—Evenson, Wands, Edwards, Lenahan & McKeown

[57] ABSTRACT

The present invention provides an improved lateral drift region for both bipolar and MOS devices where improved breakdown voltage and low ON resistance are desired. A top gate of the same conductivity type as the device region with which it is associated is provided along the surface of the substrate and overlying the lateral drift region. In an MOS device, the extremity of the lateral drift region curves up to the substrate surface beyond the extremity of the top gate to thereby provide contact between the JFET channel and the MOS channel.

42 Claims, 7 Drawing Sheets

HIGH VOLTAGE LATERAL SEMICONDUCTOR DEVICE

This is a continuation of application, Ser. No. 242,405, filed Sep. 8, 1988, now abandoned which, in turn, is a continuation-in-part of application, Ser. No. 831,384, filed Jan. 7, 1986, now U.S. Pat. No. 4,823,173, issued Apr. 18, 1989.

FIELD OF THE INVENTION

The present invention relates to lateral semiconductor devices and an improved method of making lateral semiconductor devices. More specifically, the invention relates to high voltage lateral devices with reduced ON resistance and a method of making such devices.

Previous high voltage lateral devices include both MOS devices and bipolar transistors. For example, FIG. 1 illustrates a known structure which can be used as a high voltage lateral MOS device. This device is known as a lateral drift region MOS device and is dependent upon the drain-to-body junction 15 as the basic high voltage junction of the device. The drift region 17 is a P region along the top surface of the N− substrate 11 and is located so as to lie adjacent the P− drain region 12. The drift region 17 is used to connect the high voltage drain 12 to the gate 16 and source 14. The two contacts, drain contact $12_a$ and body contact $11_c$ are shown for completeness. In the operation of this circuit, the gate 16 and source 14 never assume large voltages relative to the body 11. The drift region 17 serves as a JFET channel with the portion $11_a$ of body region 11 underlying the channel acting as a JFET gate. The JFET channel 17 is designed to totally deplete when the drain 12 is reverse biased to a voltage less than the voltage necessary to reach critical field in the channel-to-body depletion layer. This design preserves the effective high breakdown voltage of drain body junction 15. Also the source 14 and gate 16 (over the gate oxide 13) are safely shielded from the high drain body voltage by the pinched off JFET channel 17.

The resistance of the lateral drift region JFET channel 17 is in series with the resistance of the MOS channel $11_b$, consequently the total channel resistance of the device is the sum of these two individual resistances. The JFET channel, which must be quite long to sustain high drain body voltages, is often the larger of the two resistance terms. Thus it is desirable to find ways to reduce the resistance of the drift region so that devices of a given size can be made with smaller channel resistance.

FIG. 2 illustrates a known structure which can be used as a high voltage lateral DMOS (LDMOS) device. In this device, an N+ drain contact 12A is formed in the N− substrate 211 and an N+ source 14 and P+ body contact $11_c$ are formed in a P− body region 240. The drift region 217 is an N− region along the top surface of the N− substrate 211 which connects the drain 12 to the gate 16 and source 14. In this high voltage device, the N− drift region 217 must be lightly doped to obtain high body 240 to drain breakdown.

The ON resistance of the LDMOS is approximately the sum of the channel resistance and the bulk resistance in the N− drift region 217. The lateral distance from the N+ drain 12 to the adjacent edge of the MOS channel $11_b$ underlying the gate on the P− body 240 must be large to allow space for the reverse bias depletion layer which spreads from the body-to-drain junction into the lightly doped drain. This distance, along with the high N− resistivity contribute to the high drift region resistance, which is often much greater than the channel resistance. Thus, it is desirable to reduce the drift region resistance of the LDMOS device.

FIG. 3 shows a known structure which can be used as a lateral bipolar transistor. Another illustration of such a device is contained in FIG. 7 of U.S. Pat. No. 4,283,236 issued Aug. 11, 1981. Referring to FIG. 3, an N− substrate 11, has an N type emitter shield 121 formed therein and P+ emitter 122 and collector 124 formed as shown. Additionally, a P− drift region 123 is provided along the surface of the substrate between the collector 124 and the emitter shield 121. In the operation of this device, the total collector resistance is equal to the sum of the resistance across the drift region 125 plus the resistance of the P+ collector between the drift region and the collector contact. In order to provide devices of equal size having a lower collector resistance, it is desirable to find ways to reduce the resistance of the drift region.

In the operation of this device, the drift region extends the collector to the edge of the emitter shield, 121, so that the base width is just that small distance between the adjacent edges of the emitter, 121, and the drift region, therefore, providing improved frequency response.

At high base-collector voltages, the drift region, 123, depletes by JFET action with the N-base, 11, and N shield, 121, which is part of the base, acting as gate before critical field is reached just as for the MOS of FIG. 1. This preserves the high breakdown of the structure.

SUMMARY OF THE INVENTION

The present invention provides a structure having a reduced channel resistance and a process capable of efficiently obtaining the structure of the invention. The reduction in channel resistance is accomplished by providing a top gate which is located between the lateral drift region of the prior art and the surface of the channel region and which may be in contact with the high voltage device region. This top gate allows the total channel doping to be increased because the top gate to channel depletion layer holds some additional channel charge when reverse biased in addition to that held by the bottom gate to channel depletion layer of the prior art structure. The ionized channel impurity atoms associated with this additional channel charge causes the reduction in channel resistance.

With respect to providing an improved LDMOS structure having a lower drift region resistance, a second drift region which is separated from the original drift region by a region of opposing conductivity is formed. The second drift region provides a conductive path which is in parallel with the original drift region thereby achieving the desired reduction in resistance. Because of the formation of the second drift region, the first enclosed drift region can now have a much higher doping than the second drift region which it replaces, while achieving the same breakdown voltage.

DETAILED DESCRIPTION OF THE INVENTION

Figure 4:
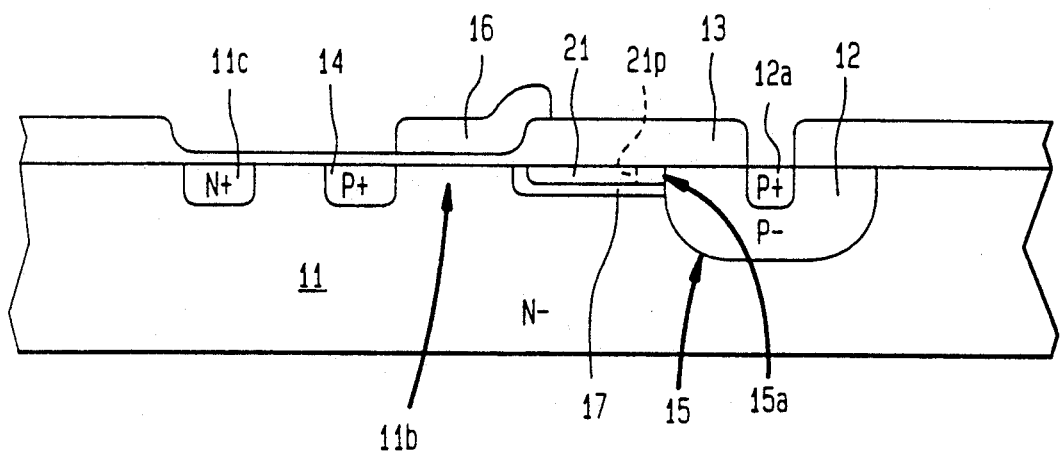
FIG. 4 is a cross section of an MOS device including the improved drift region and top gate of the invention.

The present invention is described herein with reference to the drawings for both MOS and bipolar applications. FIG. 4 shows an MOS device where P+ drain contact $12_a$ is formed in P− type drain 12, P+ source 14 is formed in the N− body 11 and N+ body contact $11_c$ is provided in the N+ body 11. The MOS channel region $11_b$ is in the N− body 11 below the MOS gate 16. The N type top gate 21 is provided along the surface $11_s$ of the body 11 above the P type drift region 17 which acts as a JFET channel. The lateral edge or peripheral edge of both the top gate 21 and drift region 17 extend to the drain-to-body junction 15 and preferably terminate at the junction 15. It is noted that situations may exist where the doping level in the top gate may be sufficiently high so as to render it desirable to provide a shorter top gate having a lateral extension which stops short of contacting the junction 15. In this case care should be taken to insure that any nondepleted portion of the top gate does not result in a breakdown of the top gate-to-drift region junction 17A. Proper doping of the top gate 21 will generally be a sufficient preventative step. Dashed line $21_p$ designates the peripheral edge of top gate 21 in an embodiment where the top gate does not extend all the way to the junction 15.

Figure 1:
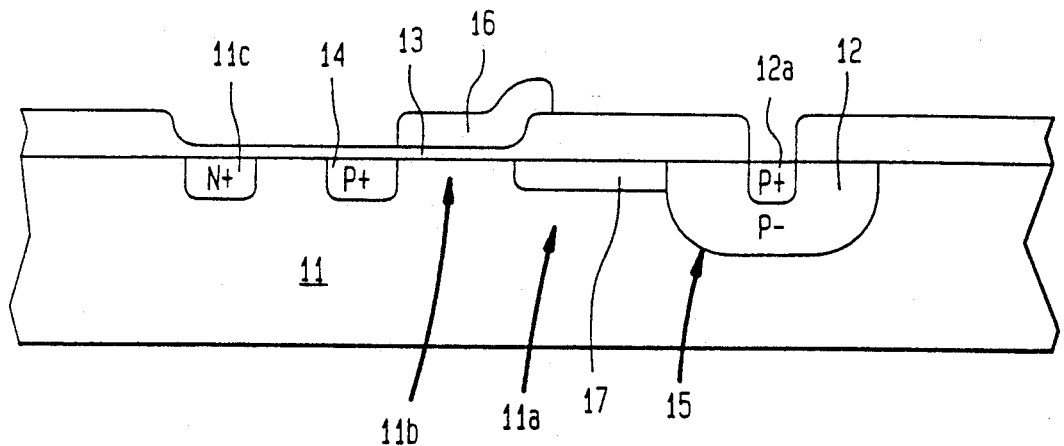
FIG. 1 is a cross section of a known MOS device having typical ON resistance.

The structure of FIG. 4 provides reduced ON resistance in the JFET channel 17 relative to the prior art lateral drift MOS device as shown in FIG. 1. The reduction in ON resistance is accomplished by providing a structure which can accommodate increased drift region doping without suffering from reduced body-to-drain breakdown. This is possible because of the provision of the top gate 21. The top gate-to-channel depletion layer which holds some channel charge when reverse biased, is in addition to the channel charge held by the bottom gate to channel depletion layer of the prior art. This additional channel charge, in the form of ionized channel impurity atoms, causes the reduction in channel resistance. It is possible to provide more than twice the doping level previously acceptable due to the additional ability to hold channel change. Thus, for a drift region 17 having a doping of $1 \times 10^{12}$ boron atoms per square centimeter in a bottom gate arrangement, the present invention will permit $2 \times 10^{12}$ boron atoms per square centimeter. Thus, the ON resistance will be only half the ON resistance of the prior arrangement.

Figure 6A:
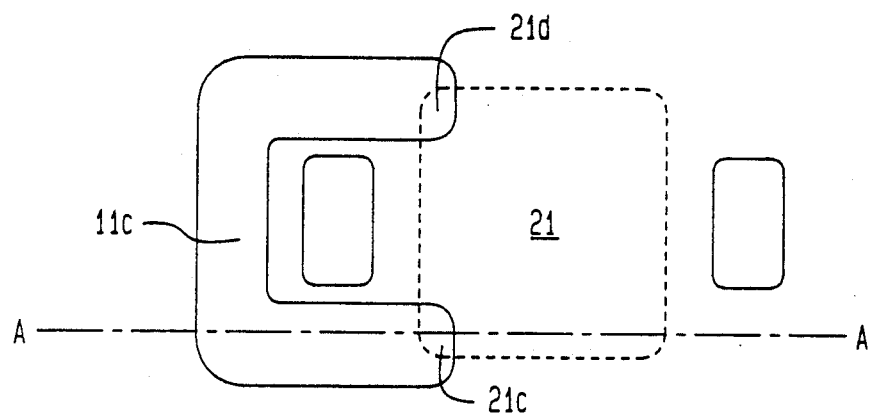
FIGS. 6a and 6b are, respectively, a top view and a cutaway perspective view of the body contact extending through the top gate and drift region of the invention.
Figure 6B:
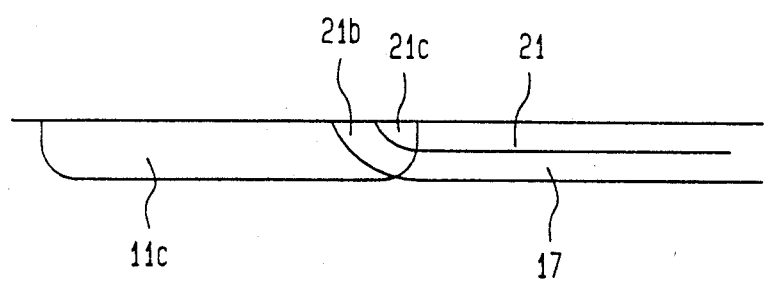

In order to optimize performance of the structure of the invention, the top gate 21 must be designed differently than an ordinary JFET gate. Top gate 21 should become totally depleted at a body-to-drain voltage of less than the breakdown voltage of the top gate-to-drain junction 15. Since top gate 21 is connected to body 11 (as shown in FIGS. 6A, 6B to be described below), the voltage at the top gate-to-drain junction $15_a$ will equal the voltage of the body-to-drain junction 15 voltage and the top gate-to-drain breakdown voltage should be greater than the voltage at which top gate 21 becomes totally depleted. Additionally, the top gate 21 must totally deplete before the body 11 to channel 17 depletion layer reaches the top gate 21 to channel 17 depletion layer to thereby assure that a large top gate 21 to drain 12 voltage is not developed by punch-through action from the body 11. An ordinary JFET gate never totally depletes regardless of operating conditions.

Figure 5:
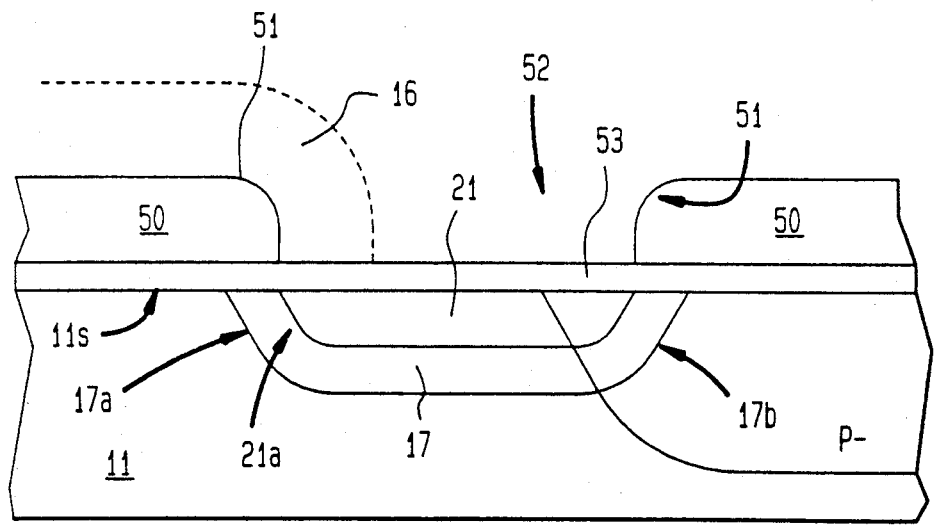
FIG. 5 illustrates optimized process steps for obtaining the desired shape of the top gate and drift region of the invention.

In addition to the above described characteristics of the device of the invention, it is also necessary to insure that the channel of the JFET drift region 17 contacts the inversion layer MOS surface channel. This can be accomplished as shown in FIG. 5 where an implant mask 50 having a tapered edge 51 is provided over the body 11. An implant aperture 52 is provided in mask 50 at the location where the P drift region 17 and N top gate 21 are to be formed. The aperture 52 is shown as exposing the protective oxide 53. Ion implantation is not substantially affected by the oxide 53 due to the oxide thickness of only about 0.1-0.2 micrometers, yet the oxide provides surface passivation for the underlying body 11.

The drift region 17 is ion implanted and, because of the graduated thickness of the implant mask 50 (along the edge 51), the depth of the implanted drift region 17 is graduated or tapered. In the illustration, a fairly good rounding of the drift region 17 occurs at the peripheral edges or extremeties $17_a$, $17_b$ of the region 17. The curved extremity $17_a$ is of interest because at this location the channel of the JFET drift region 17 contacts the surface $11_s$ of body 11 beyond the end $21_a$ of top gate 21 and is desirably beneath the gate 16 of the MOS device. The top gate 21 may be ion-implanted using the implant mask 50 but at an energy level which results in a shallower implantation. This tapered profile, particularly if curved, provides improved performance.

In a variation of this method, a diffusion process can be used to bring the JFET channel into contact with the surface of body 11, and hence insure that the JFET channel 17 will contact the inversion layer MOS surface channel (lateral drift region 17 and top gate 21 are diffused after initial introduction by ion implant). The doping levels and diffusion times are chosen such that the extremity $17_a$ of JFET channel 17 diffuses beyond the end $21_a$ of the top gate 21 and so that the end $17_a$ reaches the surface $11_s$ of body 11. In practice, this approach can be facilitated by choosing a top gate dopant which has a lower diffusion coefficient than that of the drift region dopant.

The formation of the drift region 17 and top gate 21 may be conveniently carried out by forming a mask over the gate oxide which is present in a lateral MOS application. The MOS gate may be utilized as one delineating edge of the implant for the drift region and top gate and a thick oxide portion surrounding a thinner oxide portion may form the remainder of the implant mask. The thinner oxide portion shall be located such that it extends from beneath the MOS gate to the drain and preferably overlaps the drain. The implant mask 50 illustrated in FIG. 5 is shown as having thin oxide portion 53 being surrounded by the implant mask 50. If the MOS gate 16 shown in dashed lines were used as a portion of the mask 50, the edge of the drift region and top gate would be self-aligned with the MOS gate as shown in dashed lines. Then, when diffused, the drift region will extend laterally to a point beneath the MOS gate, while the top gate 21 may be formed such that there is little or no lateral overlap with the MOS gate. The extent of lateral diffusion of the top gate is dependent upon the dopant material and processing temperatures following top gate implant. It is noted that there is a separation between the drift region and the source. This separation zone is the location where the MOS channel is located.

The top gate 21 will perform as previously described if it is tied to the body 11. Thus, the top gate 21 and the body which operates as the bottom gate of the JFET channel will be at equal potential. According to the invention, this may be accomplished in a particularly effective manner if the drift region 17 is widened to overlap with the body contact region $11_c$. This is shown in FIG. 6a which shows the overlapping of the top gate 21 and the body contact $11_c$ at the overlap regions $21_c$, $21_d$. In order for this arrangement to be effective, it is necessary that the body contact $11_c$ have a higher dopant concentration than the JFET channel (or drift region) 17, as shown in FIG. 6b to insure that the body contact $11_c$ forms a continuous region horizontally and/or vertically through the JFET channel and to the body region 11 from the top gate, 21.

FIG. 6b shows a cross section of the structure of FIG. 6a taken along dashed line A—A. The body 11 is provided with body contact $11_c$ which is located such that the top gate 21 and drift region 17 can be conveniently extended to overlap the body contact $11_c$. The depth of body contact $11_c$ may be made greater than the depth of region 17 such that a portion of the body contact $11_c$ extends below region 17 and provides contact with the body 11. This arrangement provides a contact portion $21_c$ where the top gate 21 is in contact with body contact $11_c$. Thus, as long as the body contact doping concentration in region $21_b$ is sufficiently high to overcome the opposite doping in region 17, then a good connection of uniform conductivity type will be provided between the top gate 21 and the body 11, via contact region $11_c$. It is also noted that the body contact $11_c$ extends laterally beyond the end of both of the top gate 21 and the drift region 17. The lateral extension of the contact $11_c$ will also provide a structure which results in a good connection of uniform conductivity type from the top gate 21 to the body 11, again, provided that the doping of body contact $11_c$ converts region $21_b$.

Figure 3:
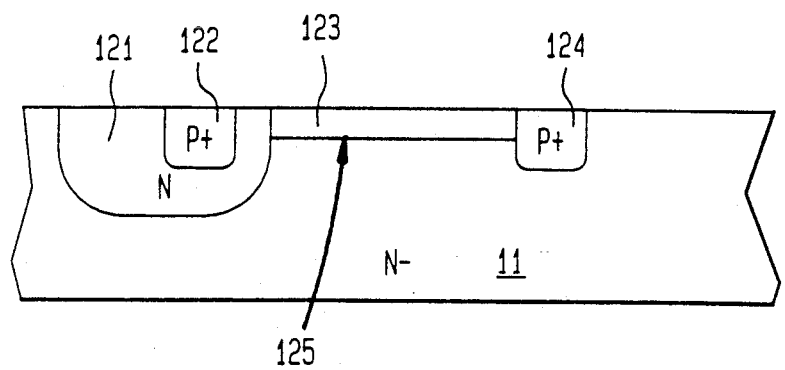
FIG. 3 is a cross section of a known bipolar transistor having typical collector resistance.
Figure 7:
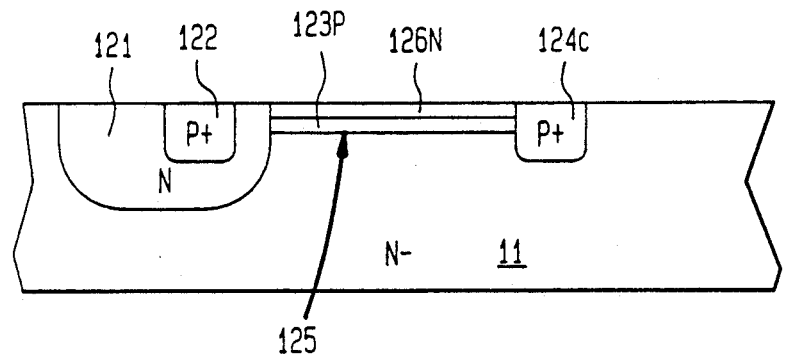
FIG. 7 is a cross section of a bipolar device made in accordance with one aspect of the invention.

Another area where the present invention finds application is in lateral bipolar transistors which employ a lateral drift region. The known structure of FIG. 3 may be improved by providing an N type top gate 126 as shown in FIG. 7. In this arrangement the N type gate 126 extends from the collector 124 to the emitter shield 121 along the surface of body 11. The operation of this device is enhanced by the same phenomenon as the lateral drift region of the previously described MOS device. As the base 11 becomes positive relative to the collector 124, the top gate-to-drift region depletion layer facilitates pinch-off of the drift region 123. However, as the base 11 becomes more negative, the top gate 126 contributes additional surface exposure to the drift region 123 and further enhances carrier transportation.

Figure 8:
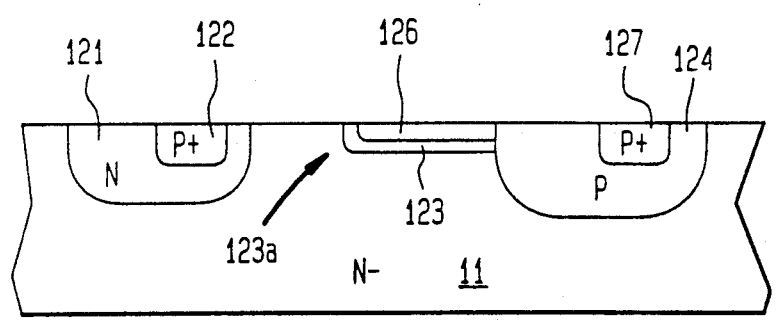
FIG. 8 is a cross section of a bipolar device made in accordance with another aspect of the invention.

FIG. 8 shows an improvement over the arrangement shown in FIG. 7. In FIG. 8 the drift region 123 does not extend all the way over to the emitter shield 121. The curved end $123_a$ of the drift region 123 contacts the top surface of body 11. It is noted that in this arrangement, the emitter shield 121 may be omitted.

An additional improvement shown in FIG. 8 is the use of a deep diffusion to form the collector 124 resulting in a significantly increased breakdown voltage. The deep diffusion step may be the same step used for forming the emitter, in which case the collector 124 shown in FIG. 7 would be deeper, or a separate collector implant and diffusion step may be employed and the collector contact 127 may then be formed simultaneously with the formation of the emitter 122. This improvement in junction breakdown voltage is equally obtainable, for example, at the body to drain junction in the MOS devices described previously.

Figure 9:
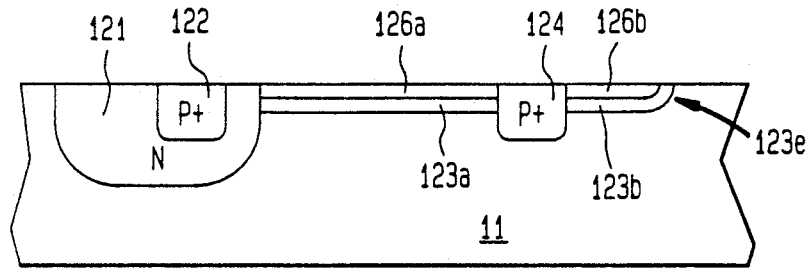
FIG. 9 is a cross section of a bipolar device made in accordance with a preferred aspect of the invention.

A further extension of the invention which may be used to increase base-to-collector breakdown voltage for a PNP device is shown in FIG. 9. In addition to the provision of the N type top gate $126_a$ over the P− drift region $123_a$, the top gate 126A and drift region 123A are enlarged to surround the collector 124 and a curved edge $123_e$ is provided at the periphery of the enlarged portion $123_b$ of the drift region 123A. This enlarged portion is designated by reference numerals $123_b$ for the drift region and $126_b$ for the top gate. The collector 124 to base 11 breakdown voltage is increased relative to alternative arrangements because of mitigation of the breakdown reduction due to the junction curvature. The top gate $126_a$ extends to the emitter shield 121 as does the drift region $123_a$. The P+ emitter 122 is formed in the N+ type emitter shield 121.

Figure 10:
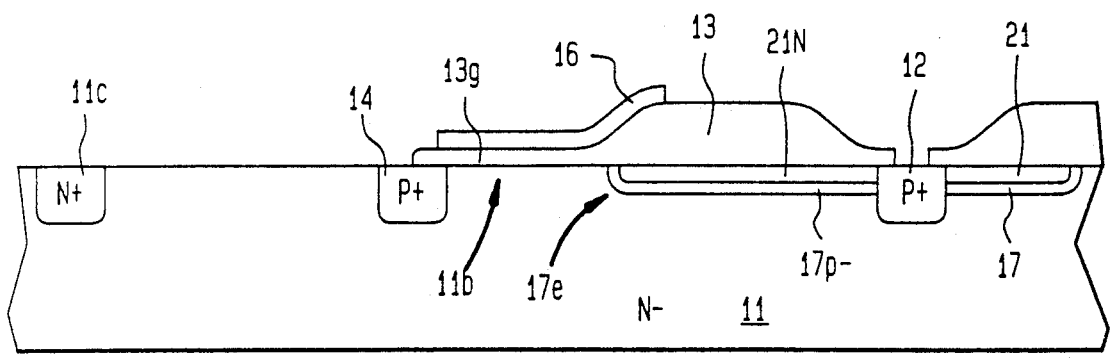
FIG. 10 is a cross section of an MOS device, including the lateral drift region and top gate of the invention, in a preferred embodiment.

FIG. 10 illustrates an extension of the invention with respect to a P channel MOS device similar to the improvement described with respect to the bipolar device shown in FIG. 9. For the MOS device, the drain 12 is surrounded by the P− drift region 17 and N type top gate 21. Around the entire periphery of the drift region 17 there is a curved portion $17_e$ which rounds up to the surface of the N− substrate 11 to insure that the JFET channel in the drift region 17 contacts the MOS channel $11_b$ under the MOS gate 16. The drift region 17 extends outward from the entire perimeter of the drain 12. This arrangement mitigates the breakdown reduction due to junction curvature. The P+ source 14 and N+ body contact $11_c$ are shown as is the dielectric 13 which serves as the gate oxide $13_g$ beneath the MOS gate 16.

In both the arrangements shown in FIG. 9 and FIG. 10, the planar diode breakdown improvement created by the drift region acting as a surface layer of the same conductivity type as the collector in FIG. 9 and drain in FIG. 10 and extending out from the perimeter of the collector and drain can be implemented by a single series of process steps. According to the invention, a common set of process steps produces both a suitable breakdown improvement layer and an improved drift region. The breakdown improvement layer is a two layer component.

Figure 11:
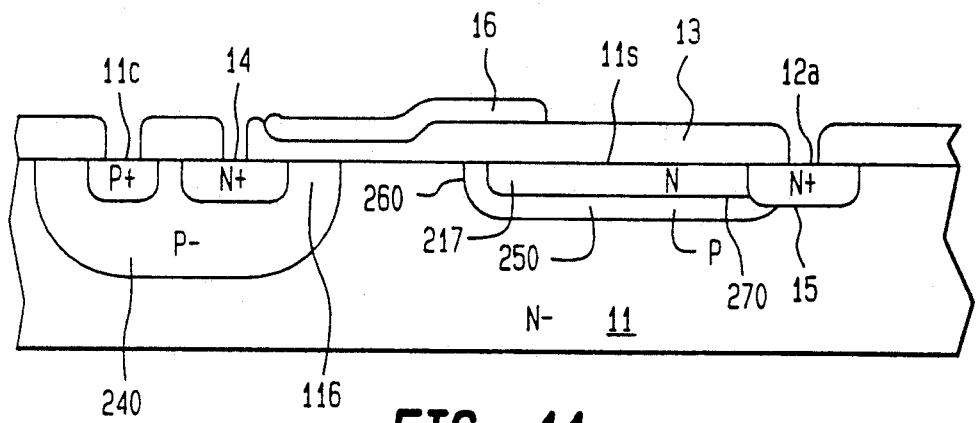
FIG. 11 is a cross section of a LDMOS device made in accordance with a preferred embodiment of the invention.

A further extension of the invention is illustrated in FIG. 11 which shows an LDMOS device where N+ drain contact $12_a$ is formed in an N− type substrate and an N+ source 14 and P+ body contact $11_c$ are formed in a P− type body region 240. The DMOS channel region $11_b$ is in the P− body 240 below the DMOS gate 16. The N type first drift region 217 is provided along the surface $11_s$ of the substrate 11 above a P− type separation region 250. A second drift region $217_a$ exists in the substrate 11 underneath the P− type separation region. The lateral edge of both the first drift region 217 and the separation region 250 extend from the gate 16 to the N+ drain contact $12_a$.

Figure 2:
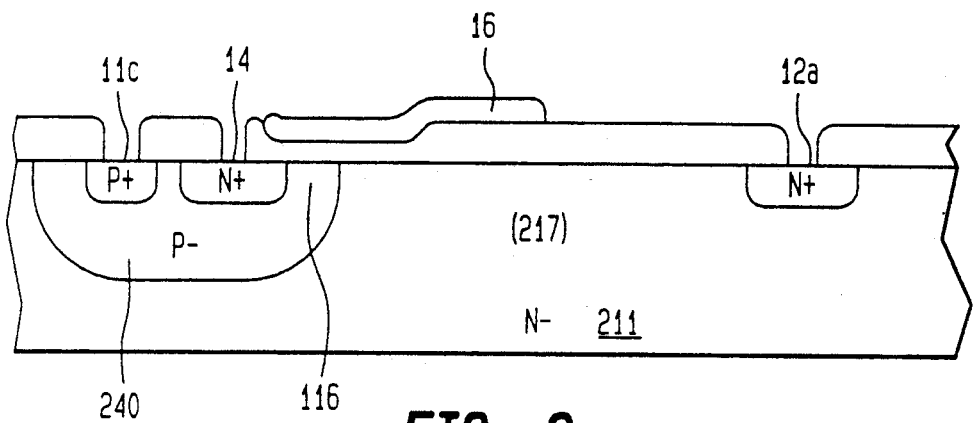
FIG. 2 is a cross section of a known LDMOS device having typical ON resistance.

The structure in FIG. 11 provides reduced ON resistance by way of the second (surface) drift region $217_a$ relative to the (deeper) prior art lateral first drift region $217_a$ device, refer to above in FIG. 2. To illustrate this, consider an example in which the N− region 11 has a doping of $1 \times 10^{14}$ ions cm$^{-3}$. The top gate layer 217 has an integrated doping of about $1 \times 10^{12}$ ions cm$^{-2}$ and is preferably not more than two microns thick while maintaining full breakdown. The thickness of the N and P layers 217, 250 together is preferably less than ten microns and can be less than one micron. The same integrated doping in the N− body 11 requires a thickness of 100 microns. Thus, the N and P layers 217, 250 respectively consume only a small fraction of the N− thickness required to provide doping equal to that portion of the N layer of the prior art device.

The lateral spacing between the drain contact $12_a$ and the channel $11_b$ in the device described above would be approximately 30 microns. In such a device, even if a full 100 micron thick N− body 11 were provided, it would have a higher resistance than the N− first drift region 217 provided according to the invention. This is because the average path length of current flowing from the drain contact 12A down through the thick N− body 11 and back up to the surface edge of the channel at the drain-to-body junction would be greater than the direct path through the N− first drift region.

Maximum breakdown is achieved in the invention by providing doping densities of the N and P layers 217, 250 such that they become totally depleted before breakdown is reached at any point along the junctions which they form with adjoining regions and before breakdown is reached at the junction between them. To insure that this occurs, the N region 217 should have an integrated doping not exceeding approximately $1 \times 10^{12}$ ions cm$^{-2}$ and the P region 250 should have a higher integrated doping not exceeding about 1.5 to $2 \times 10^{12}$ ions cm$^{-2}$.

Figure 12:
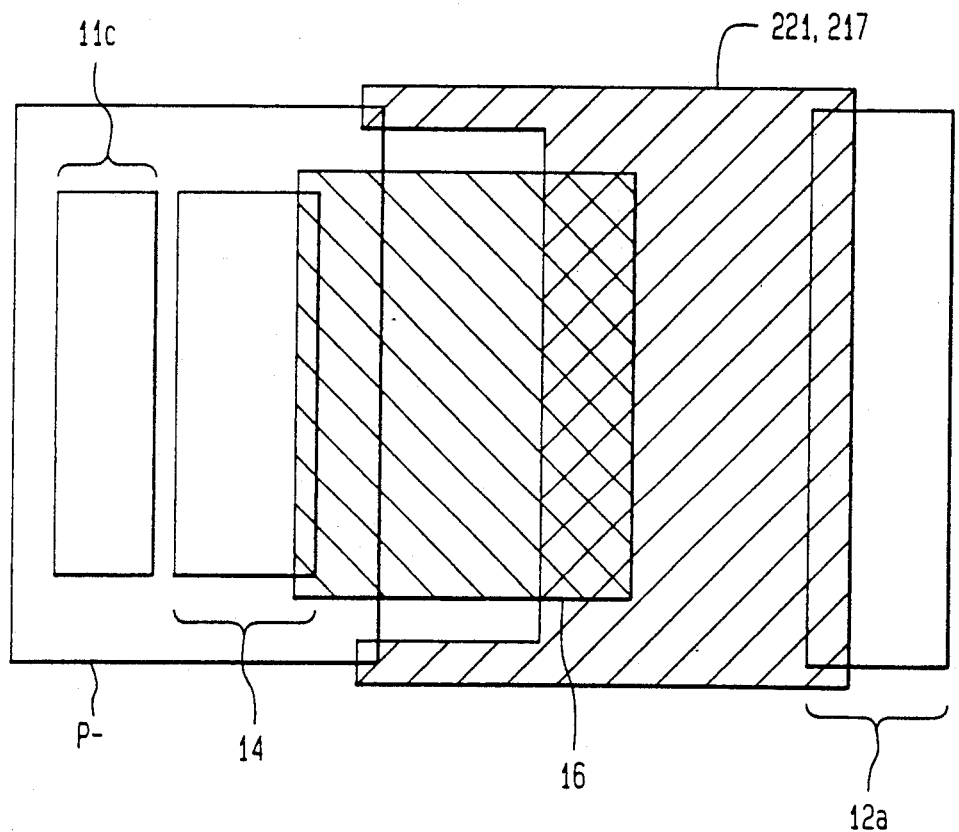
FIG. 12 is a top view of the LDMOS device of FIG. 11.

To insure proper depletion of the P and N regions 250, 217, they must have the proper voltages applied. The N layer bias is achieved by connecting the N first drift region 217 to the higher concentration N+ drain contact $12_a$ by overlapping the N first drift region 217 and drain contact $12_a$. The P region 250 bias is achieved by overlapping the P region 250 with the P− body 240 at least at one end of the channel, thereby applying the body voltage to the P layer 250. This is illustrated in FIG. 12.

With this structure and choice of doping levels, the desired results are achieved. When a reverse bias voltage is applied to the drain-to-body junction 15, the same reverse bias appears on both the PN− junction 260 and the PN junction 270. Depletion layers spread up into the N first drift region 217 and and down into the N− body 11 from the P layer 250. In a preferred embodiment, the P and N first drift region dopings are chosen such that the N layer 217 becomes totally depleted at a lower voltage than that at which the P layer 250 becomes totally depleted. This insures that no residual undepleted portion of the N layer 217 is present which could reduce breakdown voltage.

As a result of the invention, the improved DMOS device provides a reduced resistance current path in the drain which does not depend on the N− doping. This allows the N− doping to be reduced to achieve a desired breakdown voltage with good manufacturing margin, while maintaining desirable low drift region resistance. In a multi-device process which includes LDMOS devices, the N− region can be adjusted to achieve the desired characteristics of one or more of the other device types, while the N first drift region 217 sets the drift region 217 resistance of the LDMOS.

Figure 13:
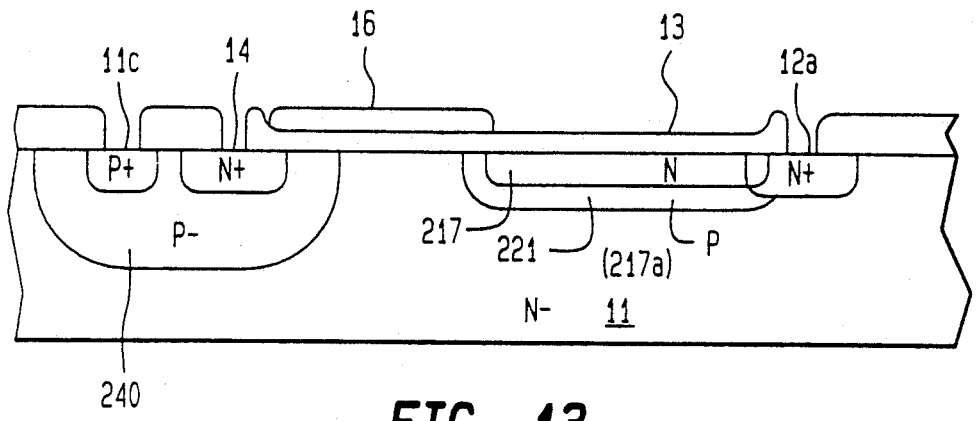
FIG. 13 is a cross section of a LDMOS device made in accordance with another preferred embodiment of the invention.

Another embodiment of the DMOS invention is illustrated in FIG. 13, where the N and P regions 217, 221 are self-aligned to the gate 16 by using the gate 16 as a mask. An advantage of this structure is that N and P regions can be defined by the uncovered thin oxide area which extends from gate edge to overlap the drain contact. This embodiment requires no explicit mask step to delineate the location where the N and P regions are formed.

Figure 14:
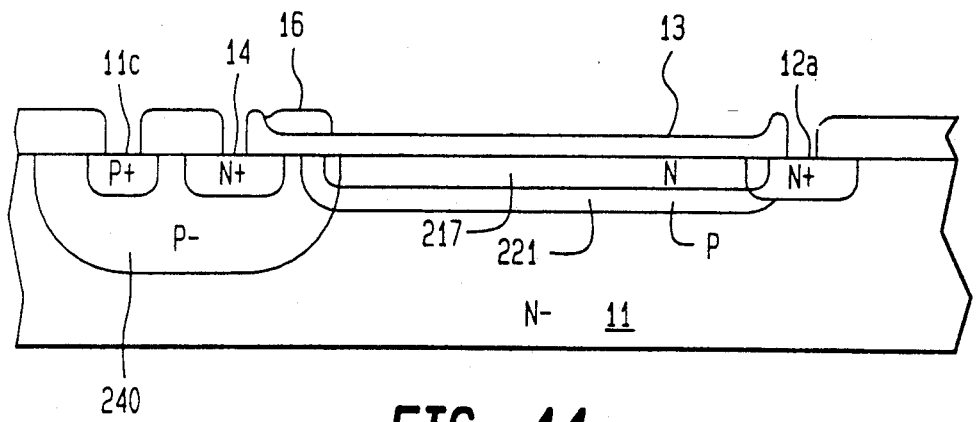
FIG. 14 is a cross section of a LDMOS device made in accordance with still another preferred embodiment of the invention.

Still another embodiment, as illustrated in FIG. 14, provides no gap between the P− body 240 and the P region 221 adjacent to the channel edge. The absence of the gap prevents current from flowing in the N− body 11; so the entire drift region current path is in the N first drift region 217. Elimination of the gap also allows the device structure to be made smaller. As with the other structure, the N and P regions may be self-aligned to the gate edge, as illustrated in FIG. 14, or not self-aligned. They may also be covered by thick or thin oxide as a design option.

A preferred feature of the present invention provides that the body or substrate regions 11 shown in the FIGS. 3, 4, 6, 7, 8, 9, 11, 13 and 14 are designed to be dielectrically or self-isolated regions. In contrast with the typical RESERF type of devices in which the bottom isolation junction plays a central role in the action of the device, the present invention contemplates that the isolation junction does not contribute to the depletion of the drift or top gate regions which are taught to be totally depleted. Prior art RESERF devices such as that described in U.S. Pat. No. 4,300,150 to Colak always require the substrate to be part of such depletion whereby the substrate must assume the most negative voltage in the device because of its role as one side of the isolation junction. As a result of this bias on the substrate or body region, the prior art RESERF type devices are susceptible to punch through from the device region through the epitaxial layer to the substrate. As a result of the present invention not having the substrate as part of the depletion mechanism, the invention can more effectively provide high voltage protection while not increasing the resistance of the channel path. Although the figures illustrate a nonisolating structure or self-isolated structure, it is understood that the invention applies equally well to dielectrically or junction isolated substrates.

While the present invention has been described with respect to several preferred manners of implementing the invention, it is to be understood that the claims appended hereto are intended to cover the invention in its broadest sense and are not to be limited to the specific implementations disclosed.

What is claimed is:

1. A semiconductor device comprising:

a semiconductor body of a first conductivity type having a first surface;

a first semiconductor region of a second conductivity type formed in a first portion of said first surface of said semiconductor body, and defining a first PN junction with said semiconductor body;

a second semiconductor region of said first conductivity type formed in a surface portion of said first semiconductor region and defining therewith a second PN junction, said second PN junction being spaced apart from said first PN junction by material of said first semiconductor region therebetween;

a third semiconductor region of said first conductivity type formed in a second surface portion of said semiconductor body, spaced apart from said first surface portion by a third surface portion thereof;

a fourth semiconductor region of said second conductivity type formed in a first surface part of said third surface portion of said semiconductor body spaced apart from said first surface portion of said semiconductor body by a second surface part of said third surface portion thereof and defining with said semiconductor body a third PN junction, said fourth semiconductor region being connected to said first semiconductor region and being contiguous with said third semiconductor region;

a fifth semiconductor region of said first conductivity type, and having an impurity concentration greater than that of said semiconductor body, formed in said fourth semiconductor region and defining therewith a fourth PN junction, said fifth semiconductor region being contiguous with said third semiconductor region;

an insulator layer formed on said first surface of said semiconductor body; and a gate electrode formed on said insulator layer so as to overlie said second surface part of said third surface portion of said semiconductor body and material of said first and fourth semiconductor regions, that portion of said first semiconductor region lying beneath said gate electrode serving as a channel region of said device, said gate electrode having a gate voltage applied to induce a conductive channel through said first semiconductor region therebeneath; and wherein when said device is reverse-biased, a first depletion region extends from said fourth PN junction into said fourth semiconductor region and said semiconductor body, and a second depletion region extends from said fifth PN junction into said fifth semiconductor region and said fourth semiconductor region;

said semiconductor body having a first ON resistance in a first current flow path therethrough between said second and third semiconductor regions, and said fifth semiconductor region providing a second ON resistance in a second current flow path along the surface of said semiconductor body from said second semiconductor region through said channel and said fourth and fifth semiconductor regions to said third semiconductor region, so that said fifth semiconductor region serves to provide a current flow path in parallel with said first current flow path, thereby effectively reducing the total ON resistance of the overall current flow path between said second and third semiconductor regions.

2. A semiconductor device according to claim 1, wherein a peripheral edge of said gate electrode is aligned with a peripheral edge of said fifth semiconductor region.

3. A semiconductor device according to claim 1, wherein said fourth semiconductor region overlaps said first semiconductor region.

4. A semiconductor device according to claim 1, wherein the impurity concentration said fifth semiconductor region is such that said fifth semiconductor region is completely depleted by said second depletion region at a reverse bias less than that at which said first and second depletion regions come together within and punch through said fourth semiconductor region.

5. A semiconductor device comprising:

a semiconductor body of a first conductivity type having a first surface;

a first semiconductor region of a second conductivity type formed in a first portion of said first surface of said semiconductor body, and defining a first PN junction with said semiconductor body;

a second semiconductor region of said first conductivity type formed in a surface portion of said first semiconductor region and defining therewith a second PN junction, said second PN junction being spaced apart from said first PN junction by material of said first semiconductor region therebetween;

a third semiconductor region of said first conductivity type formed in a second surface portion of said semiconductor body, spaced apart from said first surface portion by a third surface portion thereof;

a fourth semiconductor region of said second conductivity type formed in said third surface portion of said semiconductor body and defining with said semiconductor body a third PN junction, said fourth semiconductor region being connected to said first semiconductor region and being contiguous with said first and third semiconductor regions;

a fifth semiconductor region of said first conductivity type, and having an impurity concentration greater than that of said semiconductor body, formed in said fourth semiconductor region and defining therewith a fourth PN junction, said fifth semiconductor region being contiguous with said first and third semiconductor regions;

an insulator layer formed on said first surface of said semiconductor body; and a gate electrode formed on said insulator layer so as to overlie material of said first and fourth semiconductor regions, that portion of said first semiconductor region lying beneath said gate electrode serving as a channel region of said device, said gate electrode having a gate voltage applied to induce a conductive channel through said first semiconductor region therebeneath; and wherein when said device is reverse-biased, a first depletion region extends from said fourth PN junction into said fourth semiconductor region and said semiconductor body, and a second depletion region extends from said fifth PN junction into said fifth semiconductor region and said fourth semiconductor region.

6. A semiconductor device according to claim 5, wherein the impurity concentration said fifth semiconductor region is such that said fifth semiconductor region is completely depleted by said second depletion region at a reverse bias less than that at which said first and second depletion regions come together within and punch through said fourth semiconductor region.

7. A semiconductor device comprising:
a semiconductor body of a first conductivity type having a first surface;
a first semiconductor region of a second conductivity type formed in a first portion of said first surface of said semiconductor body, and defining a first PN junction with said semiconductor body;
a second semiconductor region of said second conductivity type formed in a second surface portion of said semiconductor body, spaced apart from said first surface portion by a third surface portion thereof and defining a second PN junction with said semiconductor body;
a third semiconductor region of said second conductivity type formed in a first surface part of said third surface portion of said semiconductor body spaced apart from said first surface portion of said semiconductor body by a second surface part of said third surface portion thereof and defining with said semiconductor body a third PN junction, said third semiconductor region being contiguous with said second semiconductor region;
a fourth semiconductor region of said first conductivity type, and having an impurity concentration greater than that of said semiconductor body, formed in said third semiconductor region and defining therewith a fourth PN junction;
an insulating layer formed on said first surface of said semiconductor body; and
a gate electrode formed on said insulator layer so as to overlie said second surface part of said third surface portion of said semiconductor body, that portion of said semiconductor body lying beneath said gate electrode serving as a channel region of said device, said gate electrode being applied with a gate voltage for inducing a conductive channel through said channel region;
said device being reverse-biased, so that a first depletion region extends from said third PN junction into said third semiconductor region and said semiconductor body and a second depletion region extends from said fourth PN junction into said third semiconductor region and said fourth semiconductor region;
said semiconductor body having a first ON resistance in a first current flow path therethrough between said first and second semiconductor regions, and said fourth semiconductor region providing a second ON resistance, less than said first ON resistance, in a second current flow path along the surface of said semiconductor body from said first semiconductor region through said channel and said third and fourth semiconductor regions to said second semiconductor region, so that said fourth semiconductor region serves to provide a reduced resistance current flow path in parallel with said first current flow path, thereby effectively reducing the total ON resistance of the overall current flow path between said first and second semiconductor regions; and
wherein the impurity concentration said fourth semiconductor region is such that said fourth semiconductor is completely depleted by said second depletion region at a reverse bias less than that at which said first and second depletion regions come together within and punch through said third semiconductor region.

8. A high voltage MOS transistor comprising:
a semiconductor substrate of a first conductivity type having a surface,
a pair of laterally spaced source and drain pockets of semiconductor material of a second conductivity type within the substrate and adjoining the substrate surface,
an extended drain region of the second conductivity type extending laterally each way from said drain pocket to surface-adjoining positions,
a surface adjoining, top layer of material of the first conductivity type on top of an intermediate portion of the extended drain region between the drain pocket and the surface-adjoining positions,
said top layer of material and said substrate being subject to application of a reverse-bias voltage,
an insulating layer on the surface of the substrate and covering at least that portion between the source pocket and the nearest surface-adjoining position of the extended drain region, and
a gate electrode on the insulating layer and electrically isolated from the substrate region thereunder which forms a channel laterally between the source pocket and the nearest surface-adjoining position of the extended drain region, said gate electrode controlling by field-effect the flow of current thereunder through the channel.

9. A high voltage MOS transistor according to claim 8, wherein said extended drain region has an impurity concentration greater than $1 \times 10^{12}$ cm$^{-2}$.

10. A high voltage MOS transistor according to claim 8, further including an ohmic contact region of said first conductivity type formed in a surface adjoining portion of said semiconductor subscrate, said ohmic contact region overlapping said top layer of material.

11. A high voltage MOS transistor comprising:
semiconductor material of a first conductivity type having a surface,
a pair of laterally spaced source and drain pockets of semiconductor material of a second conductivity type within the substrate and adjoining the surface of said semiconductor material,
an extended drain region of the second conductivity type extending laterally from said drain pocket to a surface-adjoining position,
a surface adjoining top layer of material of the first conductivity type on top of an intermediate portion of the extended drain region between the drain pocket and said surface-adjoining position,
said top layer of material and said semiconductor material being subject to application of a reverse-bias voltage,
an insulating layer on the surface of said semiconductor material and covering at least that portion between the source pocket and the nearest surface-adjoining position of the extended drain region, and
a gate electrode on the insulating layer and electrically isolated from a semiconductor material region thereunder containing a channel that extends laterally between the source pocket and the nearest surface-adjoining position of the extended drain region, said gate electrode controlling by field-effect the flow of current thereunder through the channel.

12. A high voltage MOS transistor according to claim 11, wherein said extended drain region extends in a plurality of different directions from said drain pocket to respective plural surface adjoining positions.

13. A high voltage MOS transistor according to claim 11, wherein said extended drain region surrounds said drain pocket and extends to a surrounding surface adjoining position.

14. A high voltage MOS transistor according to claim 11, wherein said drain pocket comprises a first relatively deep pocket of a first impurity concentration and a second relatively shallow pocket formed in a surface portion of said first relatively deep pocket and having a second impurity concentration greater than said first impurity concentration and providing a drain contact region.

15. A high voltage MOS transistor according to claim 11, wherein said extended drain region has an impurity concentration greater than $1 \times 10^{12}$ cm$^{-2}$.

16. A high voltage MOS transistor according to claim 11, further including an ohmic contact region of said first conductivity type formed in a surface adjoining portion of said semiconductor material, said ohmic contact region overlapping said top layer of material.

17. A high voltage field effect transistor device comprising:
  semiconductor material of a first conductivity type having a surface;
  a source region of a second conductivity type formed in a first surface portion of said semiconductor material;
  a drain region of said second conductivity type formed in a second surface portion of said semiconductor material spaced apart from said first surface portion by a third surface portion therebetween;
  an extended drain region of said second conductivity type extending from said drain region beneath a first portion of said third surface portion of said semiconductor material, to adjoin a second portion of said third surface portion of said semiconductor material, spaced apart from said said second surface portion of said semiconductor material, by said first portion of said third surface portion of said semiconductor material;
  a surface region of said first conductivity type formed in said first portion of said third surface portion of said semiconductor material;
  an insulating layer disposed on said surface of said semiconductor material, so as to overlie a third portion of said third surface portion of said semiconductor material between the second portion of said third surface portion of said semiconductor material and said first surface portion of said semiconductor material; and
  a gate electrode disposed on that portion of said insulating layer overlying said third portion of said third surface portion of said semiconductor material, and wherein said surface region and said semiconductor material are subject to the application of a reverse bias voltage.

18. A high voltage field effect transistor device according to claim 17, wherein said extended drain region extends laterally in a plurality of different directions from said drain region to adjoin said second portion of said third surface portion of said semiconductor material and to adjoin a fifth surface portion of said semiconductor material.

19. A high voltage field effect transistor device according to claim 17, wherein said extended drain region surrounds said drain region and extends to a surrounding surface-adjoining portion of said semiconductor material.

20. A high voltage field effect transistor device according to claim 17, wherein said drain region comprises a first relatively deep region of a first impurity concentration and a second relatively shallow region formed in a surface portion of said first relatively deep region and having a second impurity concentration greater than said first impurity concentration and providing a drain contact region.

21. A high voltage field effect transistor device according to claim 17, wherein said extended drain region has an impurity concentration greater than $1 \times 10^{12}$ cm$^{-2}$.

22. A high voltage field effect transistor device according to claim 17, further including an ohmic contact region of said first conductivity type formed in a surface adjoining portion of said semiconductor material, said ohmic contact region overlapping said surface region.

23. An integrated MOS/JFET transistor device comprising an insulated gate field effect transistor and a double-sided junction field effect transistor integrated together in semiconductor substrate which contains a source region, and a drain region, and a dual channel path formed in said semiconductor material between said source and drain regions, said dual channel path comprising an insulated gate-controlled channel region having a first conductivity type in the presence of a channel-inducing gate voltage, said insulated gate controlled channel region being contiguous with a double-sided junction channel region of said first conductivity type, and wherein said source region adjoins said insulated gate-controlled channel region and said drain region adjoins said double-sided channel region.

24. An integrated MOS/JFET transistor device according to claim 23, wherein said insulated gate-controlled channel region comprises a surface portion of said semiconductor material adjoining said source region, and wherein said double-sided junction channel region comprises an extended drain region extending laterally from said drain region beneath a top gate region to said surface portion of said semiconductor material, an underlying portion of said semiconductor material extending beneath and adjoining said extended drain region and forming a bottom gate, said top gate region and said bottom gate forming respective PN junctions with said double-sided junction channel region.

25. An integrated MOS/JFET transistor device according to claim 23, wherein said extended drain region and said double-sided junction channel region surround said drain region and extend to a surrounding surface-adjoining position.

26. An integrated MOS/JFET transistor device according to claim 23, wherein said extended drain region and said double, wherein said drain region comprises a first relatively deep region of a first impurity concentration and a second relatively shallow region formed in a surface portion of said first relatively deep region and having a second impurity concentration greater than said first impurity concentration and providing a drain contact region.

27. An integrated MOS/JFET transistor device according to claim 23, wherein said extended drain region and said double, further including an ohmic contact region of said first conductivity type formed in a surface adjoining portion of said semiconductor material, said ohmic contact region overlapping said top gate.

28. An integrated MOS/JFET transistor device according to claim 23, wherein said extended drain region has an impurity concentration greater than $1 \times 10^{12}$ cm$^{-2}$.

29. A high voltage MOS transistor comprising:
semiconductor material of a first conductivity type having a surface;
source and drain regions of a second conductivity type adjoining spaced apart portions of the surface of said semiconductor material;
an extended drain region of said second conductivity type extending laterally from said drain region through said semiconductor material to a surface-adjoining portion of the surface of said semiconductor material;
a top gate semiconductor layer of said first conductivity type adjoining said drain region and adjoining said extended drain region along the surface of said semiconductor material to said surface-adjoining portion of the surface of said semiconductor material, said top gate semiconductor layer and said semiconductor material being subject to the application of a reverse-bias voltage;
an insulating layer on the surface of the semiconductor material and covering at least that portion of the surface of said semiconductor material between said source region and said surface-adjoining portion of said extended drain region; and
a gate electrode disposed on said insulating layer and being electrically isolated from that portion of the surface of said semiconductor material thereunder which forms a channel laterally between said source region and said surface-adjoining portion of said extended drain region, said gate electrode controlling, by field-effect, the flow of current thereunder through said channel.

30. A high voltage MOS transistor according to claim 29, wherein said extended drain region extends laterally each way from said drain region to surface-adjoining portions of the surface of said semiconductor material, and wherein said top gate semiconductor layer extends laterally in a plurality of different directions from said drain region and adjoins said extended drain region along the surface of said semiconductor material to said surface-adjoining portions of the surface of said semiconductor material.

31. A high voltage MOS transistor according to claim 29, wherein said extended drain region surrounds said drain region and extends to a surrounding surface adjoining position.

32. A high voltage MOS transistor according to claim 29, wherein said drain region comprises a first relatively deep region of a first impurity concentration and a second relatively shallow region formed in a surface portion of said first relatively deep region and having a second impurity concentration greater than said first impurity concentration and providing a drain contact region.

33. A high voltage MOS transistor according to claim 29, wherein said extended drain region has an impurity concentration greater than $1 \times 10^{12}$ cm$^{-2}$.

34. A high voltage MOS transistor according to claim 29, further including an ohmic contact region of said first conductivity type formed in a surface adjoining portion of said semiconductor material, said ohmic contact region overlapping said top gate layer.

35. A high voltage diode comprising:
semiconductor material of a first conductivity type having a surface,
a first, surface-adjoining region of a second conductivity type;
a second surface-adjoining region of said first conductivity type spaced apart from said first, surface-adjoining region;
a third region of said second conductivity type extending laterally from said first, surface-adjoining region; and
a fourth, surface-adjoining region of said first conductivity type overlying an intermediate portion of said third, laterally extending and surface-adjoining region.

36. A high voltage diode according to claim 35, wherein said third region surrounds said first, surface-adjoining region and extends to a surrounding surface adjoining position.

37. A high voltage diode according to claim 35, wherein said first region comprises a first relatively deep region of a first impurity concentration and a second relatively shallow region formed in a surface portion of said first relatively deep region and having a second impurity concentration greater than said first impurity concentration.

38. A high voltage diode according to claim 35, wherein said third region has an impurity concentration greater than $1 \times 10^{12}$ cm$^{-2}$.

39. A lateral bipolar transistor having a high voltage base-collector diode comprising:
semiconductor material of a first conductivity type having a surface and forming a base of said bipolar transistor,
a first, surface-adjoining collector region of a second conductivity type forming a base-collector junction with said semiconductor material;
a second surface-adjoining base region of said first conductivity type spaced apart from said first, surface-adjoining collector region;
a third, extended collector region of said second conductivity type extending laterally from said first, surface-adjoining collector region, so that said base-collector junction extends laterally from said first, surface adjoining collector region;
a fourth, surface-adjoining region of said first conductivity type overlying an intermediate portion of said third, laterally extending and surface-adjoining extended collector region; and
a fifth, surface-adjoining emitter region of said second conductivity type formed in said second surface-adjoining base region and defining therewith an emitter-base junction.

40. A lateral bipolar transistor according to claim 39, wherein said third region surrounds said first, surface-adjoining region and extends to a surrounding surface adjoining position.

41. A lateral bipolar transistor according to claim 39, wherein said first region comprises a first relatively deep region of a first impurity concentration and a second relatively shallow region formed in a surface portion of said first relatively deep region and having a second impurity concentration greater than said first impurity concentration.

42. A lateral bipolar transistor according to claim 39, wherein said third, extended collector region has an impurity concentration greater than $1 \times 10^{12}$ cm$^{-2}$.

* * * * *